US011316126B2

(12) United States Patent
Liu

(10) Patent No.: US 11,316,126 B2
(45) Date of Patent: Apr. 26, 2022

(54) ORGANIC LIGHT-EMITTING DIODE DISPLAY PANEL HAVING AT LEAST TWO CONNECTION SURFACES BETWEEN AUXILIARY ELECTRODE AND COMMON ELECTRODE

(71) Applicant: Shenzhen China Star Optoelectronics Semiconductor Display Technology Co., Ltd., Shenzhen (CN)

(72) Inventor: Yang Liu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 343 days.

(21) Appl. No.: 16/496,958

(22) PCT Filed: Aug. 5, 2019

(86) PCT No.: PCT/CN2019/099302
§ 371 (c)(1),
(2) Date: Sep. 24, 2019

(87) PCT Pub. No.: WO2020/224070
PCT Pub. Date: Nov. 12, 2020

(65) Prior Publication Data
US 2021/0408438 A1 Dec. 30, 2021

(30) Foreign Application Priority Data
May 5, 2019 (CN) .......................... 201910366398.3

(51) Int. Cl.
*H01L 29/08* (2006.01)
*H01L 51/52* (2006.01)
*H01L 27/32* (2006.01)

(52) U.S. Cl.
CPC ...... *H01L 51/5228* (2013.01); *H01L 27/3246* (2013.01)

(58) Field of Classification Search
CPC ........................ H01L 51/5228; H01L 27/3246
(Continued)

(56) References Cited

U.S. PATENT DOCUMENTS

2009/0315458 A1* 12/2009 Choi ................... H01L 51/5212
313/505
2010/0097295 A1 4/2010 Kwak
(Continued)

FOREIGN PATENT DOCUMENTS

| CN | 101728419 | 6/2010 |
| CN | 108011052 | 5/2018 |
| CN | 108511507 | 9/2018 |

Primary Examiner — Phuc T Dang

(57) ABSTRACT

The present disclosure provides an organic light-emitting diode (OLED) display panel including: a substrate and a cover plate assembled into a cell, and a plurality of auxiliary electrodes formed on a side of the cover plate adjacent to the substrate, the substrate including: a base; a driving circuit layer; a pixel defining layer; a luminescent material layer; and a common electrode, wherein protrusions are provided on a surface of the pixel defining layer away from the driving circuit layer in at least one of the pixel defining regions, and the auxiliary electrodes and the common electrode have at least two electrical connection surfaces in each of the pixel defining regions provided with the protrusions correspondingly. The present disclosure improves connection efficiency of the auxiliary electrodes with the common electrode.

14 Claims, 4 Drawing Sheets

(58) Field of Classification Search
USPC .......................................................... 257/40
See application file for complete search history.

(56) References Cited

U.S. PATENT DOCUMENTS

| | | |
|---|---|---|
| 2016/0035803 A1 | 2/2016 | Kim et al. |
| 2017/0279076 A1* | 9/2017 | Song ................... H01L 27/3246 |
| 2018/0114820 A1* | 4/2018 | Shim ................... H01L 27/3246 |
| 2019/0189706 A1* | 6/2019 | Choi ....................... H01L 51/56 |
| 2020/0313113 A1 | 10/2020 | Zang et al. |
| 2020/0343315 A1* | 10/2020 | Lin ..................... H01L 51/5228 |

* cited by examiner

ORGANIC LIGHT-EMITTING DIODE DISPLAY PANEL HAVING AT LEAST TWO CONNECTION SURFACES BETWEEN AUXILIARY ELECTRODE AND COMMON ELECTRODE

RELATED APPLICATIONS

This application is a National Phase of PCT Patent Application No. PCT/CN2019/099302 having International filing date of Aug. 5, 2019, which claims the benefit of priority of Chinese Patent Application No. 201910366398.3 filed on May 5, 2019. The contents of the above applications are all incorporated by reference as if fully set forth herein in their entirety.

FIELD AND BACKGROUND OF THE INVENTION

The present disclosure relates to a field of display technologies, and in particular, to an organic light-emitting diode (OLED) display panel.

In an existing top-emitting organic light-emitting diode (OLED) device, auxiliary electrodes are usually disposed above a common electrode to reduce impedance of the common electrode and alleviate IR-drop (power supply voltage drop).

A structure of the existing OLED display panel is as shown in FIG. 1, which includes a substrate 100 and a cover plate 200 assembled into a cell, and auxiliary electrodes 300 formed on the cover plate 200. The substrate 100 includes a base 110, a driving circuit layer 120, and a pixel defining layer 130, an anode 140, a light emitting function layer 150, and a common electrode 160. The pixel defining layer 130 includes a plurality of pixel defining regions 1300. The common electrode 160 and the auxiliary electrodes 300 have electrical connection surfaces 400 correspondingly in each of the pixel defining regions 1300, and such a plane-to-plane electrical connection is prone to poor connection, resulting in failure of connection between the auxiliary electrodes 300 and the common electrode 160, and thus the auxiliary electrodes fail to function to reduce the impedance of the common electrode 160 and alleviate the IR-drop.

Therefore, the existing OLED display panel has a technical problem of poor connection of the common electrode and the auxiliary electrode, and needs to be improved.

SUMMARY OF THE INVENTION

The present disclosure provides an organic light-emitting diode (OLED) display panel to alleviate the technical problem of poor connection of the common electrode with the auxiliary electrodes in the existing OLED display panel.

To solve the above problem, the technical solution provided by the present disclosure is as follows:

The present disclosure provides an organic light-emitting diode (OLED) display panel, including: a substrate and a cover plate assembled into a cell, and a plurality of auxiliary electrodes formed on a side of the cover plate adjacent to the substrate, the substrate including: a base; a driving circuit layer formed on the base; a pixel defining layer formed on the driving circuit layer for defining a plurality of sub-pixel regions, wherein the pixel defining layer includes a plurality of pixel defining regions, and protrusions are provided on a surface of the pixel defining layer away from the driving circuit layer in at least one of the pixel defining regions; a luminescent material layer formed in the sub-pixel regions defined by the pixel defining layer; a common electrode formed on the luminescent material layer and the pixel defining layer, wherein the plurality of auxiliary electrodes are disposed corresponding to the plurality of pixel defining regions, and the auxiliary electrodes and the common electrode have at least two electrical connection surfaces in each of the pixel defining regions provided with the protrusions correspondingly.

In the OLED display panel of the present disclosure, only one of the plurality of auxiliary electrodes is disposed in each of the pixel defining regions provided with the protrusions correspondingly.

In the OLED display panel of the present disclosure, the auxiliary electrodes have a trapezoidal cross-sectional shape.

In the OLED display panel of the present disclosure, the auxiliary electrodes have a rectangular cross-sectional shape.

In the OLED display panel of the present disclosure, at least a first auxiliary electrode and a second auxiliary electrode are disposed in each of the pixel defining regions correspondingly provided with the protrusions, and the first auxiliary electrode and the second auxiliary electrode are both connected to the cover plate.

In the OLED display panel of the present disclosure, the first auxiliary electrode and the second auxiliary electrode have a same cross-sectional shape.

In the OLED display panel of the present disclosure, the first auxiliary electrode and the second auxiliary electrode have different cross-sectional shapes.

In the OLED display panel of the present disclosure, in the pixel defining regions correspondingly provided with the protrusions, a portion of the pixel defining regions is correspondingly provided with only one of the plurality of auxiliary electrodes, and another portion of the pixel defining regions is correspondingly provided with at least a first auxiliary electrode and a second auxiliary electrode, wherein the first auxiliary electrode and the second auxiliary electrode are both connected to the cover plate.

In the OLED display panel of the present disclosure, the pixel defining layer is integrally formed in at least one of the pixel defining regions.

In the OLED display panel of the present disclosure, the pixel defining layer includes at least a first sub-pixel defining layer and a second sub-pixel defining layer in at least one of the pixel defining regions, and the first sub-pixel defining layer and the second sub-pixel defining layer are both disposed on the driving circuit layer.

In the OLED display panel of the present disclosure, each of the first sub-pixel defining layer and the second sub-pixel defining layer has a planar surface away from the driving circuit layer, and a height of the first sub-pixel defining layer is greater than a height of the second sub-pixel defining layer.

In the OLED display panel of the present disclosure, the first sub-pixel defining layer and the second sub-pixel defining layer have planar surfaces of a same height away from the driving circuit layer, and projections of the surfaces of the first sub-pixel defining layer and the second sub-pixel defining layer away from the driving circuit layer on the driving circuit layer are not connected with each other.

In the OLED display panel of the present disclosure, a surface of at least one of the first sub-pixel defining layer and the second sub-pixel defining layer away from the driving circuit layer is provided with the protrusions in at least one of the pixel defining regions.

In the OLED display panel of the present disclosure, cross-sectional shapes of all the protrusions in each of the sub-pixel defining layers are same.

In the OLED display panel of the present disclosure, the cross-sectional shapes of the protrusions provided on the surfaces of the first sub-pixel defining layer and the second sub-pixel defining layer away from the driving circuit layer are same.

In the OLED display panel of the present disclosure, the cross-sectional shapes of the protrusions provided on the surfaces of the first sub-pixel defining layer and the second sub-pixel defining layer away from the driving circuit layer are different.

In the OLED display panel of the present disclosure, in at least one of the pixel defining regions, the pixel defining layer includes at least a first sub-pixel defining layer and a second sub-pixel defining layer, wherein the first sub-pixel defining layer is disposed on the driving circuit layer, and the second sub-pixel defining layer is disposed on the first sub-pixel defining layer.

In the OLED display panel of the present disclosure, in the pixel defining regions provided with the protrusions, a portion of the pixel defining layer has an integrally formed structure, and another portion of the pixel defining layer includes at least a first sub-pixel defining layer and a second sub-pixel defining layer.

In the OLED display panel of the present disclosure, the first sub-pixel defining layer and the second sub-pixel defining layer are both disposed on the driving circuit layer.

In the OLED display panel of the present disclosure, the first sub-pixel defining layer is disposed on the driving circuit layer, and the second sub-pixel defining layer is disposed on the first sub-pixel defining layer.

The beneficial effect of the present disclosure is as follows: the present disclosure provides an organic light-emitting diode (OLED) display panel including cover plate assembled into a cell, and a plurality of auxiliary electrodes formed on a side of the cover plate adjacent to the substrate, the substrate including: a base, a driving circuit layer, a pixel defining layer, a luminescent material layer, and a common electrode, the driving circuit layer being formed on the substrate; the pixel defining layer being formed on the driving circuit layer for defining a plurality of sub-pixel regions, the pixel defining layer including a plurality of pixel defining regions, and protrusions are provided on a surface of the pixel defining layer away from the driving circuit layer in at least one of the pixel defining regions, the luminescent material layer being formed on the pixel defining layer a defined sub-pixel region, the common electrode being formed on the luminescent material layer and the pixel defining layer, wherein the plurality of auxiliary electrodes are disposed corresponding to the plurality of pixel defining regions, and the auxiliary electrodes and the common electrode have at least two electrical connection surfaces in each of the pixel defining regions provided with the protrusions correspondingly. By forming the protrusions on the surface of the pixel defining layer away from the driving circuit layer, the auxiliary electrodes and the common electrode have at least two electrical connection surfaces in each of the pixel defining regions provided with the protrusions correspondingly, thereby improving connection efficiency between the auxiliary electrodes and the common electrode, thus ensuring that the auxiliary electrodes can function to reduce the impedance of the common electrode and alleviate the IR-drop.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DESCRIPTION OF SPECIFIC EMBODIMENTS OF THE INVENTION

Figure 1:
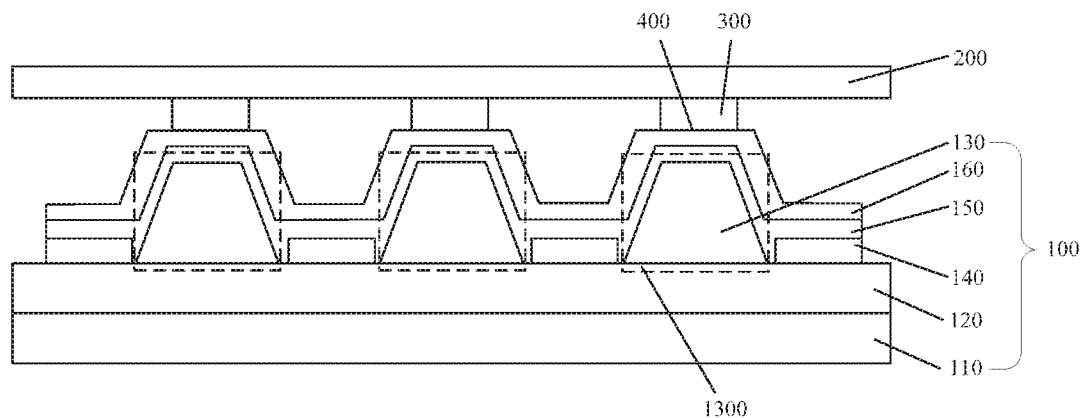
FIG. 1 is a schematic structural view of an organic light-emitting diode (OLED) display panel according to the prior art.

The following description of the various embodiments is provided to illustrate the specific embodiments of the invention. Directional terms mentioned in the present invention, such as "vertical", "horizontal", "upper", "bottom", "pre", "post", "left", "right", "inside", "outside", "side", etc., only refer to the direction of the additional drawing. Therefore, the directional terminology used is for the purpose of illustration and understanding of the invention. In the figures, structurally similar elements are denoted by the same reference numerals.

The present disclosure provides an organic light-emitting diode (OLED) display panel to alleviate the technical problem of poor connection of a common electrode with auxiliary electrodes in an existing OLED display panel.

Figure 2:
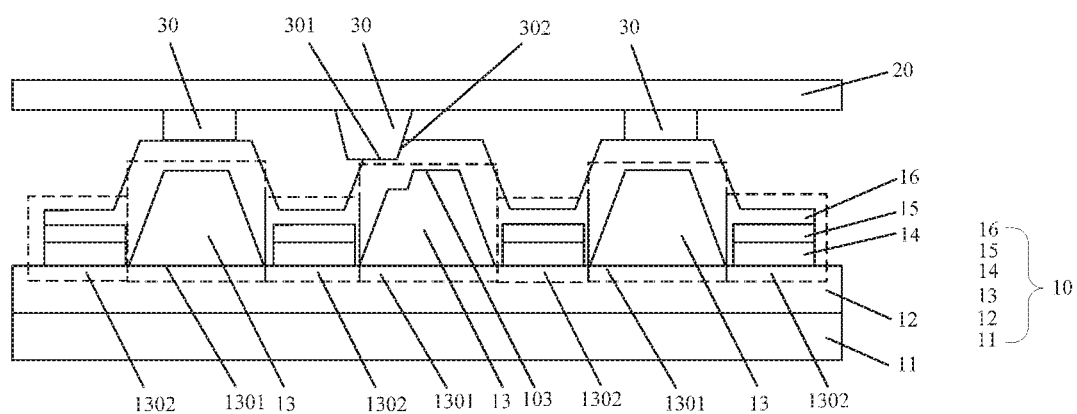
FIG. 2 is a schematic diagram of a first structure aspect of an organic light-emitting diode (OLED) display panel according to an embodiment of the present disclosure.
Figure 3A:
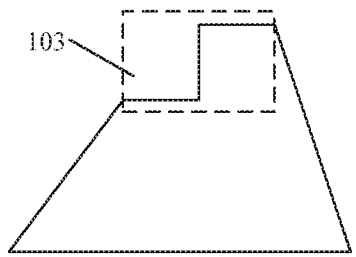
FIGS. 3a, 3b, 3c and 3d are schematic structural diagrams of an organic light-emitting diode (OLED) display panel having a pixel defining layer provided with protrusions according to an embodiment of the present disclosure.
Figure 3B:
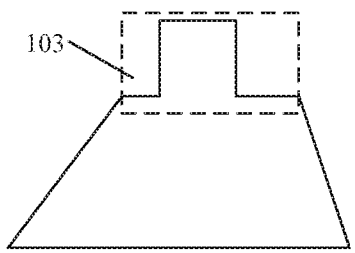
Figure 3C:
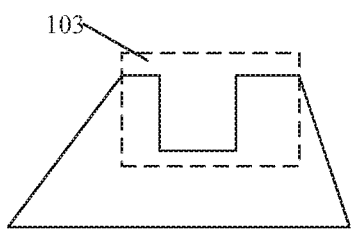
Figure 3D:
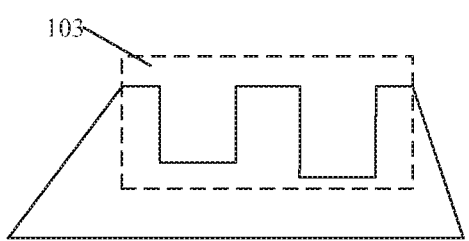

FIG. 2 is a schematic diagram showing a first structure aspect of an organic light-emitting diode (OLED) display panel provided by an embodiment of the present disclosure. As shown in FIG. 2, the OLED display panel includes a substrate 10 and a cover plate 20 assembled into a cell, and a plurality of auxiliary electrodes 30 formed on a side of the cover plate 20 adjacent to the substrate 10. The substrate 10 includes a base 11, a driving circuit layer 12, and a pixel defining layer 13, a pixel electrode 14, a luminescent material layer 15, and a common electrode 16.

The base 11 is typically a glass substrate, but is not particularly limited thereto, and may be, for example, a flexible substrate. The driving circuit layer 12 is formed on the base 11, and includes a plurality of thin film transistors (not shown) for driving the OLED display panel.

The pixel defining layer 13 is formed on the driving circuit layer 12. The pixel defining layer 13 includes a plurality of pixel defining regions 1301. The pixel defining layer 13 is configured to define a plurality of sub-pixel regions 1302. The sub-pixel regions 1302 are formed between two adjacent pixel defining regions 1301. In at least one pixel defining region 1301, protrusions are provided on the surface 103 of the pixel defining layer 13 away from the driving circuit layer 12, The pixel electrode 14 is formed on the driving circuit layer 12 and is located in the sub-pixel region 1302. A drain electrode of the thin film transistor in the driving circuit layer 12 can be electrically connected to the pixel electrode 14.

The luminescent material layer 15 is formed in the sub-pixel region 1302 defined by the pixel defining layer 13, and the common electrode 16 is formed on the luminescent material layer 15 and the pixel defining layer 13.

The auxiliary electrodes 30 are disposed on a side of the cover plate 20 adjacent to the substrate 10, and the plurality of auxiliary electrodes 30 are disposed corresponding to the plurality of pixel defining regions 1301.

In an embodiment, only one of the plurality of auxiliary electrodes 30 is disposed in each of the pixel defining regions 1301 provided with the protrusions correspondingly, and the auxiliary electrodes 30 may have a trapezoidal cross-sectional shape, a rectangular cross-sectional shape, or other cross-sectional shapes.

When the cover plate 20 and the substrate 10 are laminated, the auxiliary electrodes 30 and the common electrode 16 have at least two electrical connection surfaces in each of the pixel defining regions 1301 provided with the protrusions correspondingly. As shown in FIG. 1, the auxiliary electrodes 30 and the common electrode 16 have a first electrical connection surface 301 and a second electrical connection surface 302.

In an embodiment, the pixel defining layer 13 only in a portion of the pixel defining regions 1301 is provided with protrusions on its surface 103 away from the driving circuit layer 12.

In an embodiment, the pixel defining layer 13 in all the pixel defining regions 1301 is provided with protrusions on its surface 103 away from the driving circuit layer 12.

In an embodiment, in the pixel defining region 1301 provided with the protrusions, the pixel defining layer 13 is integrally formed, and the structure of the pixel defining layer 13 is as shown in FIG. 3.

As shown by "a" and "b" in FIG. 3, the surface 103 of the pixel defining layer 13 away from the driving circuit layer 12 includes a protrusion which may have a trapezoidal cross-sectional shape, a rectangular cross-sectional shape, or other cross-sectional shapes.

As shown by "c" in FIG. 3, the surface 103 of the pixel defining layer 13 away from the driving circuit layer 12 includes two protrusions, and a concave surface is formed between the two protrusions, and the protrusions may have a trapezoidal cross-sectional shape, a rectangular cross-sectional shape, or other cross-sectional shapes. The shapes and sizes of the two protrusions may or may not be equal.

As shown by "d" in FIG. 3, the surface 103 of the pixel defining layer 13 away from the driving circuit layer 12 includes three protrusions, and two concave surfaces are formed between the three protrusions, and the protrusions may have a trapezoidal cross-sectional shape, a rectangular cross-sectional shape, or other cross-sectional shapes. The shapes and sizes of the three protrusions may or may not be equal, and the three protrusions may be spaced apart from each other at equal intervals or at different intervals.

Of course, the shape of the surface 103 of the pixel defining layer 13 away from the driving circuit layer 12 is not limited thereto, and more protrusions may be formed. The protrusions may have straight surfaces or curved surfaces. The cross-sectional shapes of all the protrusions may be equal. Alternatively, at least one of the protrusions may have a cross-sectional shape different from the other protrusions, and all the protrusions may be arranged at equal intervals or may be arranged at unequal intervals.

By forming the protrusions on the surface 103 of the pixel defining layer 13 away from the driving circuit layer 12, the auxiliary electrodes 30 and the common electrode 16 have at least two electrical connection surfaces in each of the pixel defining regions 1301 correspondingly provided with the protrusions. When the cover plate 20 and the substrate 10 are laminated, if one of the electrical connection surfaces is not electrically connected, there is still another electrical connection surface to realize the electrical connection. Comparted with the structure that only one electrical connection surface provided between the auxiliary electrodes 30 and the common electrode 16, the structure having at least two electrical connection surfaces improves the connection yield of the auxiliary electrodes 30 with the common electrode 16, thereby ensuring that the auxiliary electrodes 30 can function to reduce impedance of the common electrode 16 and alleviate IR-drop.

Figure 4:
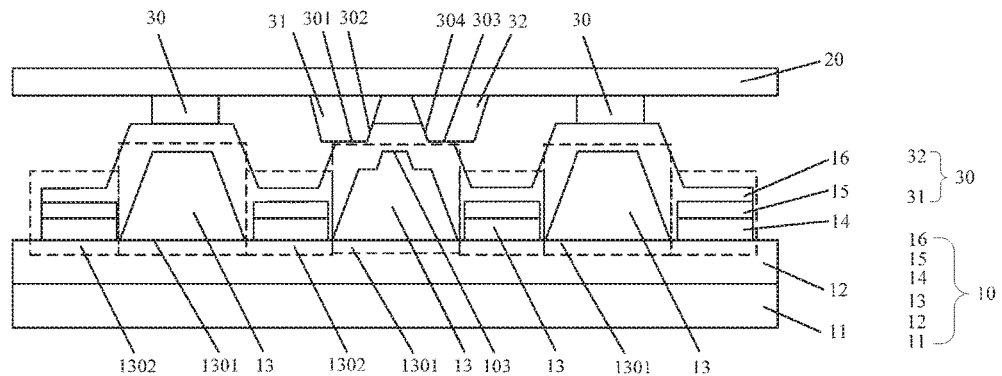
FIG. 4 is a schematic diagram of a second structure aspect of an organic light-emitting diode (OLED) display panel according to an embodiment of the present disclosure.

FIG. 4 is a schematic diagram of a second structure aspect of an organic light-emitting diode (OLED) display panel according to an embodiment of the present disclosure. As shown in FIG. 4, the organic light-emitting diode (OLED) display panel includes a substrate 10 and a cover plate 20 assembled into a cell, and a plurality of auxiliary electrodes 30 formed on a side of the cover plate 20 adjacent to the substrate 10, and the substrate 10 includes a base 11, a driving circuit layer 12, a pixel defining layer 13, a pixel electrode 14, a luminescent material layer 15, and a common electrode 16.

The difference from the structure in FIG. 2 is that, in each of the pixel defining regions 1301 provided with the protrusions correspondingly, the auxiliary electrodes 30 include at least a first auxiliary electrode 31 and a second auxiliary electrode 32, and the first auxiliary electrode 31 and the second auxiliary electrode 32 both are connected to the cover plate 20. The cross-sectional shape of the first auxiliary electrode 31 and the cross-sectional shape of the second auxiliary electrode 32 may be the same or different.

When the cover plate 20 and the substrate 10 are laminated, the auxiliary electrodes 30 and the common electrode 16 have four electrical connection surfaces in each of the pixel defining regions 1301 provided with the protrusions correspondingly, which are respectively a first electrical connection surface 301, a second electrical connection surface 302, a third electrical connection surface 303, and a fourth electrical connection surface 304 between the auxiliary electrodes 32 and the common electrode 16.

Since the auxiliary electrodes 30 and the common electrode 16 have four electrical connection surfaces, if one of the electrical connection surfaces is not electrically connected, there are still other electrical connection surfaces to realize the electrical connection. Compared with the structure having only one electrical connection surface between the auxiliary electrodes 30 and the common electrode 16, the structure having at least two electrical connection surfaces improves the connection yield of the auxiliary electrodes 30 with the common electrode 16, thereby ensuring that the auxiliary electrodes 30 can function to reduce impedance of the common electrode 16 and alleviate IR-drop.

Figure 5:
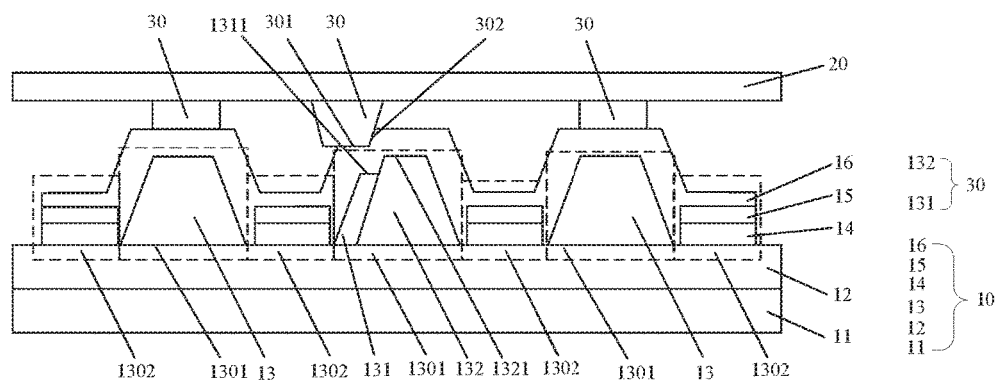
FIG. 5 is a schematic diagram of a third structure aspect of an organic light-emitting diode (OLED) display panel according to an embodiment of the present disclosure.

FIG. 5 is a schematic diagram of a third structure aspect of an organic light-emitting diode (OLED) display panel according to an embodiment of the present disclosure. As shown in FIG. 5, an organic light-emitting diode (OLED) display panel includes a substrate 10 and a cover plate 20 assembled into a cell, and a plurality of auxiliary electrodes 30 formed on a side of the cover plate 20 adjacent to the substrate 10. The auxiliary electrodes 30 includes a base 11, a driving circuit layer 12, a pixel defining layer 13, a pixel electrode 14, a luminescent material layer 15, and a common electrode 16.

In each of the pixel defining regions 1301 provided with the protrusions correspondingly, the pixel defining layer 13 includes at least a first sub-pixel defining layer 131 and a second sub-pixel defining layer 132, which are both disposed on the driving circuit layer 12.

In an embodiment, the surface 1311 of the first sub-pixel defining layer 131 away from the driving circuit layer 12 and the surface 1321 of the second sub-pixel defining layer 132 away from the driving circuit layer 12 are planar surfaces, and the first sub-pixel defining layer 131 has a height greater than the second sub-pixel defining layer 132. Since the heights of the first sub-pixel defining layer 131 and the second sub-pixel defining layer 132 are different, the pixel defining layer 13 composed of the first sub-pixel defining layer 131 and the second sub-pixel defining layer 132 has a surface provided with the protrusions away from the driving circuit layer 12.

In an embodiment, only one auxiliary electrode 30 is provided in each of the pixel defining regions 1301 formed with the protrusions correspondingly, and the cross-sectional shape of the auxiliary electrodes 30 may have a trapezoidal cross-sectional shape, a rectangular cross-sectional shape, or other cross-sectional shapes. When the cover plate 20 and the substrate 10 are laminated, the auxiliary electrodes 30 and the common electrode 16 have a first electrical connection surface 301 and a second electrical connection surface 302.

In an embodiment, in each of the pixel defining regions 1301 corresponding to each of the protrusions formed, the auxiliary electrodes 30 includes at least a first auxiliary electrode 31 and a second auxiliary electrode 32, which are both connected to the cover plate 20, and the cross-sectional shape of the first auxiliary electrode 31 and the cross-sectional shape of the second auxiliary electrode 32 may be the same or different. When the cover plate 20 and the substrate 10 are laminated, the auxiliary electrodes 30 and the common electrode 16 have more electrical connection surfaces in each of the pixel defining regions 1301 correspondingly formed with the protrusions.

Since the auxiliary electrodes 30 and the common electrode 16 have at least two electrical connection surfaces, if one of the electrical connection surfaces is not electrically connected, there is still another electrical connection surface to realize the electrical connection. Compared with the structure having only one electrical connection surface provided between the auxiliary electrodes 30 and the common electrode 16, the structure having at least two electrical connection surfaces improves the connection yield of the auxiliary electrodes 30 with the common electrode 16, thereby ensuring that the auxiliary electrodes 30 can function to reduce impedance of the common electrode 16 and alleviate IR-drop.

Figure 6:
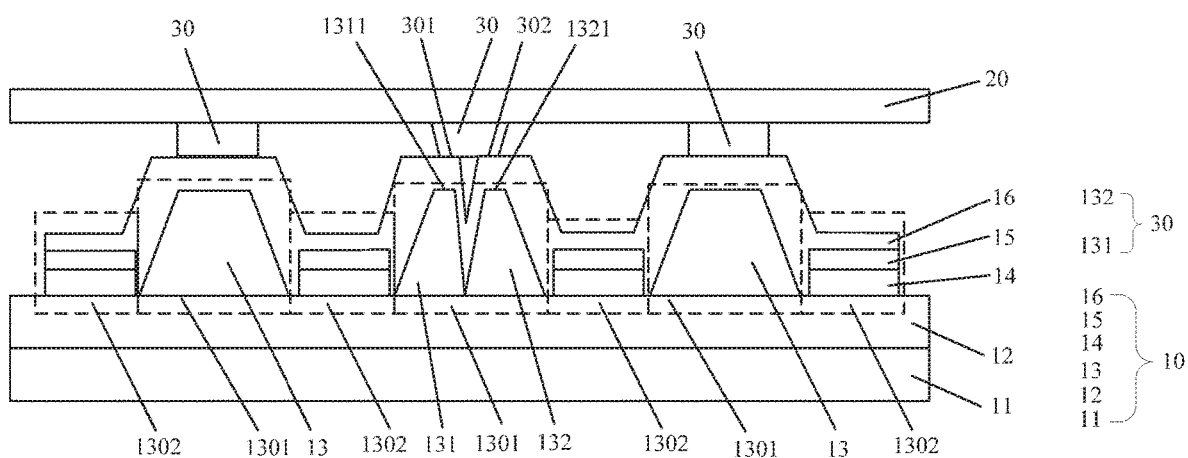
FIG. 6 is a schematic diagram of a fourth structure aspect of an organic light-emitting diode (OLED) display panel according to an embodiment of the present disclosure.

FIG. 6 is a schematic diagram of a fourth structure aspect of an organic light-emitting diode (OLED) display panel according to an embodiment of the present disclosure. As shown in FIG. 6, an organic light-emitting diode (OLED) display panel includes a substrate 10 and a cover plate 20 assembled into a cell, and a plurality of auxiliary electrodes 30 formed on a side of the cover plate 20 adjacent to the substrate 10. The substrate 10 includes a base 11, a driving circuit layer 12, a pixel defining layer 13, a pixel electrode 14, a luminescent material layer 15, and a common electrode 16.

In each of the pixel defining regions 1301 formed with the protrusions correspondingly, the pixel defining layer 13 includes at least a first sub-pixel defining layer 131 and a second sub-pixel defining layer 132, which are both disposed on the driving circuit layer 12.

The surface 1311 of the first sub-pixel defining layer 131 away from the driving circuit layer 12 and the surface 1321 of the second sub-pixel defining layer 132 away from the driving circuit layer 12 are planar surfaces, and the height of the first sub-pixel defining layer 131 is equal to that of the second sub-pixel defining layers 132, and the projection of the surface 1311 of the first sub-pixel defining layer 131 away from the driving circuit layer 12 and the projection of the surface 1312 of the second sub-pixel defining layer 132 away from the driving circuit layer 12 on the driving circuit layer 12 are not connected with each other. That is, the pixel defining layer 13 composed of the first sub-pixel defining layer 131 and the second sub-pixel defining layer 132 is formed with the protrusions on its surface away from the driving circuit layer 12.

In each of the pixel defining regions 1301 provided with the protrusions correspondingly, a plurality of auxiliary electrodes 30 may be disposed. In this embodiment, only one auxiliary electrode 30 is provided. When the cover plate 20 and the substrate 10 are laminated, the auxiliary electrodes 30 and the common electrode 16 have a first electrical connection surface 301 and a second electrical connection surface 302. When a number of auxiliary electrodes 30 increases, a number of electrical connection surfaces also increases.

Since the auxiliary electrodes 30 and the common electrode 16 have at least two electrical connection surfaces, if one of the electrical connection surfaces is not electrically connected, there is still another electrical connection surface to realize the electrical connection. Compared with the structure having only one electrical connection surface provided between the auxiliary electrodes 30 and the common electrode 16, the structure having at least two electrical connection surfaces improves the connection yield of the auxiliary electrodes 30 with the common electrode 16, thereby ensuring that the auxiliary electrodes 30 can function to reduce impedance of the common electrode 16 and alleviate IR-drop.

Figure 7:
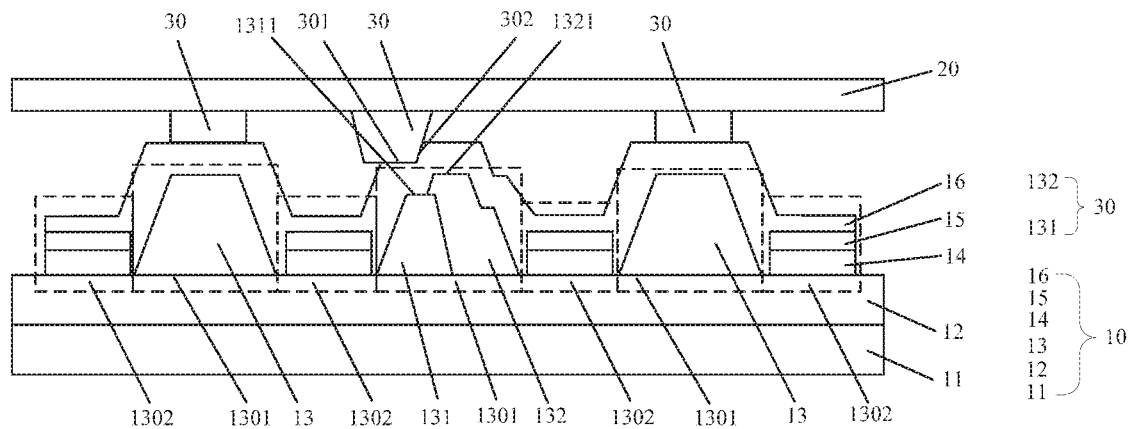
FIG. 7 is a schematic diagram of a fifth structure aspect of an organic light-emitting diode (OLED) display panel according to an embodiment of the present disclosure.

FIG. 7 is a schematic diagram of a fifth structure aspect of an organic light-emitting diode (OLED) display panel according to an embodiment of the present disclosure. As shown in FIG. 7, an organic light-emitting diode (OLED) display panel includes a substrate 10 and a cover plate 20 assembled into a cell, and a plurality of auxiliary electrodes 30 formed on a side of the cover plate 20 adjacent to the substrate 10. The substrate 10 includes a base 11, a driving circuit layer 12, a pixel defining layer 13, a pixel electrode 14, a luminescent material layer 15, and a common electrode 16.

In each of the pixel defining regions 1301 provided with the protrusions correspondingly, the pixel defining layer 13 includes at least a first sub-pixel defining layer 131 and a second sub-pixel defining layer 132, which are both disposed on the driving circuit layer 12.

The first sub-pixel defining layer 131 has a planar surface 1311 away from the driving circuit layer 12, and the second sub-pixel defining layer 132 is provided with the protrusions on a surface away from the driving circuit layer 12.

The surface 1321 of second sub-pixel defining layer 132 away from the driving circuit layer 12 includes one or more protrusions. The protrusions may have a trapezoidal cross-sectional shape, a rectangular cross-sectional shape, or other cross-sectional shapes, and the protrusions may have straight surfaces or curved surfaces. The cross-sectional shapes of all the protrusions may be equal. Alternatively, at least one of the protrusions may have a cross-sectional shape different from the other protrusions, and all the protrusions may be arranged at equal intervals or may be arranged at unequal intervals.

In each of the pixel defining regions 1301 provided with the protrusions correspondingly, a plurality of auxiliary electrodes 30 may be disposed. In this embodiment, only one auxiliary electrode 30 is provided. When the cover plate 20 and the substrate 10 are laminated, the auxiliary electrodes 30 and the common electrode 16 have a first electrical connection surface 301 and a second electrical connection surface 302. When a number of auxiliary electrodes 30 increases, a number of electrical connection surfaces also increases.

Since the auxiliary electrodes 30 and the common electrode 16 have at least two electrical connection surfaces, if one of the electrical connection surfaces is not electrically connected, there is still another electrical connection surface to realize the electrical connection. Compared with the structure having only one electrical connection surface provided between the auxiliary electrodes 30 and the common electrode 16, the structure having at least two electrical connection surfaces improves the connection yield of the auxiliary electrodes 30 with the common electrode 16, thereby ensuring that the auxiliary electrodes 30 can function to reduce impedance of the common electrode 16 and alleviate IR-drop.

Figure 8:
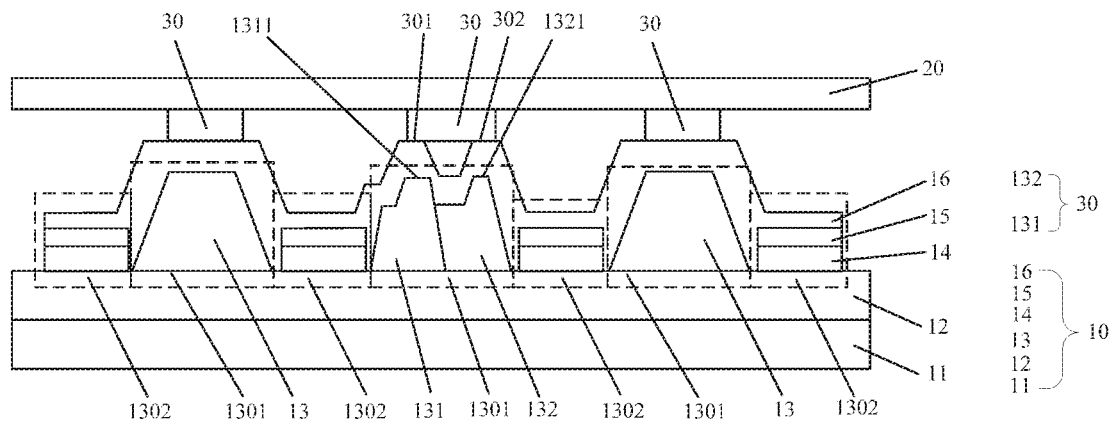
FIG. 8 is a schematic diagram of a sixth structure aspect of an organic light-emitting diode (OLED) display panel according to an embodiment of the present disclosure.

FIG. 8 is a schematic diagram of a sixth structure aspect of an organic light-emitting diode (OLED) display panel according to an embodiment of the present disclosure. As shown in FIG. 8, an organic light-emitting diode (OLED) display panel includes a substrate 10 and a cover plate 20 assembled into a cell, and a plurality of auxiliary electrodes 30 formed on a side of the cover plate 20 adjacent to the substrate 10. The substrate 10 includes a base 11, a driving circuit layer 12, a pixel defining layer 13, a pixel electrode 14, a luminescent material layer 15, and a common electrode 16.

In each of the pixel defining regions 1301 provided with the protrusions correspondingly, the pixel defining layer 13 includes at least a first sub-pixel defining layer 131 and a second sub-pixel defining layer 132, which are both disposed on the driving circuit layer 12.

The surface 1311 of the first sub-pixel defining layer 131 away from the driving circuit layer 12 and the surface 1321 of the second sub-pixel defining layer 132 away from the driving circuit layer 12 are provided with the protrusions. The cross-sectional shapes of all the protrusions may be equal. Alternatively, at least one of the protrusions may have a cross-sectional shape different from the other protrusions, and all the protrusions may be arranged at equal intervals or may be arranged at unequal intervals.

The cross-sectional shapes of all the protrusions on the surface 1311 of the first sub-pixel defining layer 131 away from the driving circuit layer 12 may be the same, or the at least one protrusions may be different from the cross-sectional shape of the other protrusions, and the second sub-pixel defining layer 132 is away from the driving. The cross-sectional shapes of all the protrusions on the surface 1321 of the circuit layer 12 may be the same, or at least one of the protrusions may be different from the cross-sectional shape of the other protrusions.

When the cross-sectional shapes of all the protrusions on the surface 1311 of the first sub-pixel defining layer 131 away from the driving circuit layer 12 are the same, and the cross-sectional shapes of all the protrusions on the surface 1321 of the second sub-pixel defining layer 132 away from the driving circuit layer 12 are also the same, the cross-sectional shapes of all the protrusions in the two sub-pixel defining layers may be the same or different.

In each of the pixel defining regions 1301 provided with the protrusions correspondingly, a plurality of auxiliary electrodes 30 may be disposed. In this embodiment, only one auxiliary electrode 30 is provided. When the cover plate 20 and the substrate 10 are laminated, the auxiliary electrodes 30 and the common electrode 16 have a first electrical connection surface 301 and a second electrical connection surface 302. When a number of auxiliary electrodes 30 increases, a number of electrical connection surfaces also increases.

Since the auxiliary electrodes 30 and the common electrode 16 have at least two electrical connection surfaces, if one of the electrical connection surfaces is not electrically connected, there is still another electrical connection surface to realize the electrical connection. Compared with the structure having only one electrical connection surface provided between the auxiliary electrodes 30 and the common electrode 16, the structure having at least two electrical connection surfaces improves the connection yield of the auxiliary electrodes 30 with the common electrode 16, thereby ensuring that the auxiliary electrodes 30 can function to reduce impedance of the common electrode 16 and alleviate IR-drop.

Figure 9:
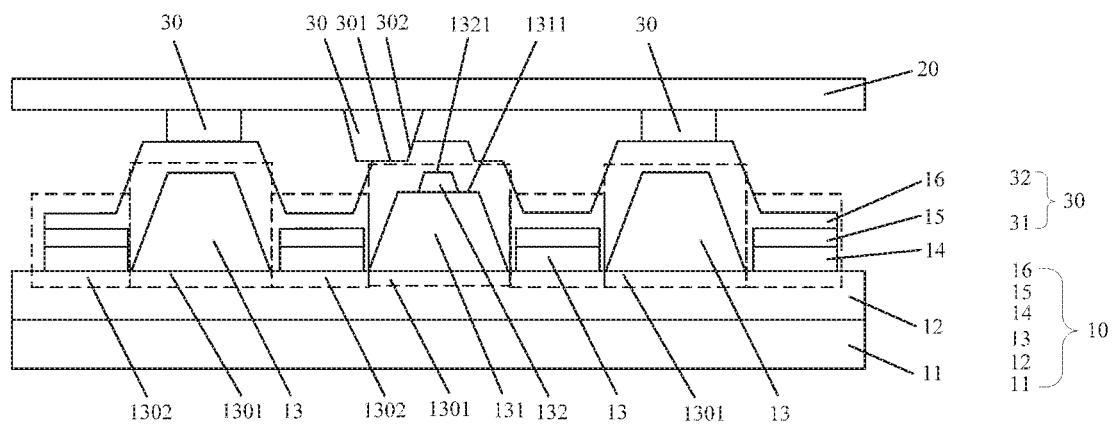
FIG. 9 is a schematic diagram of a seventh structure aspect of an organic light-emitting diode (OLED) display panel according to an embodiment of the present disclosure.

FIG. 9 is a schematic diagram of a seventh structure aspect of an organic light-emitting diode (OLED) display panel according to an embodiment of the present disclosure. As shown in FIG. 9, an organic light-emitting diode (OLED) display panel includes a substrate 10 and a cover plate 20 assembled into a cell, and a plurality of auxiliary electrodes 30 formed on a side of the cover plate 20 adjacent to the substrate 10. The substrate 10 includes a base 11, a driving circuit layer 12, a pixel defining layer 13, a pixel electrode 14, a luminescent material layer 15, and a common electrode 16.

In each of the pixel defining regions 1301 provided with the protrusions correspondingly, the pixel defining layer 13 includes at least a first sub-pixel defining layer 131 and a second sub-pixel defining layer 132, wherein the first sub-pixel defining layer 131 is disposed on the driving circuit layer 12, and the second sub-pixel defining layer 132 is disposed on the first sub-pixel defining layer 131. The laminated structure of the first sub-pixel defining layer 131 and the second sub-pixel defining layer 132 causes the protrusions formation on the surface of the pixel defining layer 13 away from the driving circuit layer 12.

In each of the pixel defining regions 1301 provided with the protrusions correspondingly, a plurality of auxiliary electrodes 30 may be disposed. In this embodiment, only one auxiliary electrode 30 is provided. When the cover plate 20 and the substrate 10 are laminated, the auxiliary electrodes 30 and the common electrode 16 have a first electrical connection surface 301 and a second electrical connection surface 302. When a number of auxiliary electrodes 30 increases, a number of electrical connection surfaces also increases.

Since the auxiliary electrodes 30 and the common electrode 16 have at least two electrical connection surfaces, if one of the electrical connection surfaces is not electrically connected, there is still another electrical connection surface to realize the electrical connection. Compared with the structure having only one electrical connection surface provided between the auxiliary electrodes 30 and the common electrode 16, the structure having at least two electrical connection surfaces improves the connection yield of the auxiliary electrodes 30 with the common electrode 16, thereby ensuring that the auxiliary electrodes 30 can function to reduce impedance of the common electrode 16 and alleviate IR-drop.

It should be noted that, in the OLED display panel of any of the above embodiments, in the pixel defining area 1301 provided with the protrusions, the pixel defining layer 13 is not particularly limited to the first sub-pixel defining layer 131 and the second sub-pixel defining layer 132. Instead, more sub-pixel defining layers may be included, and each of the sub-pixel defining layers may or may not be connected to each other, and may be a stacked arrangement or may be all disposed on the driving circuit layer 12. The pixel defining layers 13 may be integrally formed. Alternatively, at least two sub-pixel defining layers disposed on the driving circuit layer 12. Alternatively, a portion of the pixel defining layer 13 has an integrally formed structure, and another portion of the pixel defining layer 13 includes at least two sub-pixel defining layers disposed on the driving circuit layer 12.

The present disclosure also provides an organic light-emitting diode (OLED) display device, including the OLED display panel of any of the above embodiments.

According to the above embodiments, it can be known that:

The present disclosure provides an organic light-emitting diode (OLED) display panel including cover plate assembled into a cell, and a plurality of auxiliary electrodes formed on a side of the cover plate adjacent to the substrate, the substrate including: a base, a driving circuit layer, a pixel defining layer, a luminescent material layer, and a common electrode, the driving circuit layer being formed on the substrate; the pixel defining layer being formed on the driving circuit layer for defining a plurality of sub-pixel regions, the pixel defining layer including a plurality of pixel defining regions, and protrusions are provided on a surface of the pixel defining layer away from the driving circuit layer in at least one of the pixel defining regions, the luminescent material layer being formed on the pixel defining layer a defined sub-pixel region, the common electrode being formed on the luminescent material layer and the pixel defining layer, wherein the plurality of auxiliary electrodes are disposed corresponding to the plurality of pixel defining regions, and the auxiliary electrodes and the common electrode have at least two electrical connection surfaces in each of the pixel defining regions provided with the protrusions correspondingly. By forming the protrusions on the surface of the pixel defining layer away from the driving circuit layer, the auxiliary electrodes and the common electrode have at least two electrical connection surfaces in each of the pixel defining regions provided with the protrusions correspondingly, thereby improving connection yield between the auxiliary electrodes and the common electrode, thus ensuring that the auxiliary electrodes can function to reduce the impedance of the common electrode and alleviate the IR-drop.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An organic light-emitting diode (OLED) display panel comprising: a substrate and a cover plate assembled into a cell, and a plurality of auxiliary electrodes formed on a side of the cover plate adjacent to the substrate, the substrate comprising:
    a base;
    a driving circuit layer formed on the base;
    a pixel defining layer formed on the driving circuit layer for forming a plurality of sub-pixel regions, wherein the pixel defining layer comprises a plurality of pixel defining regions, and protrusions are provided on a surface of the pixel defining layer away from the driving circuit layer in at least one of the pixel defining regions;
    a luminescent material layer formed in the sub-pixel regions defined by the pixel defining layer;
    a common electrode formed on the luminescent material layer and the pixel defining layer,
    wherein the plurality of auxiliary electrodes are disposed corresponding to the plurality of pixel defining regions, and the auxiliary electrodes and the common electrode have at least two electrical connection surfaces in each of the pixel defining regions provided with the protrusions correspondingly; and
    wherein at least a first auxiliary electrode and a second auxiliary electrode are disposed in each of the pixel defining regions correspondingly provided with the protrusions, and the first auxiliary electrode and the second auxiliary electrode are both connected to the cover plate.

2. The OLED display panel of claim 1, wherein only one of the plurality of auxiliary electrodes is disposed in each of the pixel defining regions provided with the protrusions correspondingly.

3. The OLED display panel of claim 2, wherein the auxiliary electrodes have a trapezoidal cross-sectional shape.

4. The OLED display panel of claim 2, wherein the auxiliary electrodes have a rectangular cross-sectional shape.

5. The OLED display panel of claim 1, wherein the first auxiliary electrode and the second auxiliary electrode have a same cross-sectional shape.

6. The OLED display panel of claim 1, wherein the first auxiliary electrode and the second auxiliary electrode have different cross-sectional shapes.

7. The OLED display panel according to claim 1, wherein in the pixel defining regions correspondingly provided with the protrusions, a portion of the pixel defining regions is correspondingly provided with only one of the plurality of auxiliary electrodes, and another portion of the pixel defining regions is correspondingly provided with at least a first auxiliary electrode and a second auxiliary electrode, wherein the first auxiliary electrode and the second auxiliary electrode are both connected to the cover plate.

8. The OLED display panel of claim 1, wherein the pixel defining layer is integrally formed in at least one of the pixel defining regions.

9. The OLED display panel of claim 1, wherein, the pixel defining layer comprises at least a first sub-pixel defining layer and a second sub-pixel defining layer in at least one of the pixel defining regions, and the first sub-pixel defining layer and the second sub-pixel defining layer are both disposed on the driving circuit layer.

10. The OLED display panel of claim 9, wherein each of the first sub-pixel defining layer and the second sub-pixel defining layer has a planar surface away from the driving circuit layer, and a height of the first sub-pixel defining layer is greater than a height of the second sub-pixel defining layer.

11. The OLED display panel of claim 9, wherein the first sub-pixel defining layer and the second sub-pixel defining layer have planar surfaces of a same height away from the driving circuit layer, and projections of the surfaces of the first sub-pixel defining layer and the second sub-pixel defining layer away from the driving circuit layer on the driving circuit layer are not connected with each other.

12. The OLED display panel of claim 9, wherein a surface of at least one of the first sub-pixel defining layer and the second sub-pixel defining layer away from the driving circuit layer is provided with the protrusions in at least one of the pixel defining regions.

13. The OLED display panel of claim 12, wherein cross-sectional shapes of all the protrusions in each of the sub-pixel defining layers are same.

14. The OLED display panel of claim 13, wherein the cross-sectional shapes of the protrusions provided on the surfaces of the first sub-pixel defining layer and the second sub-pixel defining layer away from the driving circuit layer are same.

\* \* \* \* \*